(12) United States Patent
Arai

(10) Patent No.: US 7,749,841 B2  
(45) Date of Patent: Jul. 6, 2010

(54) METHOD OF FABRICATING NONVOLATILE SEMICONDUCTOR MEMORY DEVICE

(75) Inventor: Masatoshi Arai, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/896,015

(22) Filed: Aug. 29, 2007

(65) Prior Publication Data

US 2008/0200016 A1 Aug. 21, 2008

(30) Foreign Application Priority Data

Feb. 21, 2007 (JP) .............................. 2007-041060

(51) Int. Cl.
*H01L 21/336* (2006.01)

(52) U.S. Cl. ...................... 438/263; 438/525; 438/257; 257/E21.68; 257/E21.682; 257/321; 257/314

(58) Field of Classification Search ................ 438/525, 438/257, 263; 257/E21.68, 314, E21.682, 257/321
See application file for complete search history.

(56) References Cited

U.S. PATENT DOCUMENTS

| | | | |
|---|---|---|---|
| 6,255,166 B1 * | 7/2001 | Ogura et al. ................ 438/257 |
| 6,482,706 B1 | 11/2002 | Yeh et al. | |
| 6,803,284 B2 | 10/2004 | Hwang | |
| 2002/0001936 A1 * | 1/2002 | Terauchi et al. ............. 438/618 |
| 2005/0020010 A1 * | 1/2005 | Hsu et al. .................... 438/257 |
| 2006/0084219 A1 * | 4/2006 | Lusky et al. ................. 438/201 |
| 2006/0255396 A1 * | 11/2006 | Nara ............................ 257/315 |
| 2007/0077748 A1 * | 4/2007 | Olligs et al. ................. 438/618 |
| 2008/0017911 A1 * | 1/2008 | Akahori et al. .............. 257/314 |

FOREIGN PATENT DOCUMENTS

JP 2004247584 A * 9/2004

* cited by examiner

*Primary Examiner*—Ha Tran T Nguyen  
*Assistant Examiner*—Aaron A Dehne  
(74) *Attorney, Agent, or Firm*—McDermott Will & Emery LLP

(57) ABSTRACT

A method of fabricating a nonvolatile semiconductor memory device includes the steps of: (a) forming a layered dielectric film on the semiconductor substrate; (b) forming a first conductive film on the layered dielectric film; (c) forming a first dielectric film on the first conductive film; (d) patterning the first dielectric film and the first conductive film to form a layered pattern composed of first dielectric films and first conductive films; and (e) implanting a first impurity along a direction having an inclination angle to a normal direction to a principal plane of the semiconductor substrate by using the layered pattern as a mask to form a first impurity diffusion layer being the same in conductivity type as the semiconductor substrate, wherein, step (d) includes patterning the first dielectric film to form the first dielectric films having a shape with a width narrower in an upper surface than in a lower surface.

24 Claims, 12 Drawing Sheets

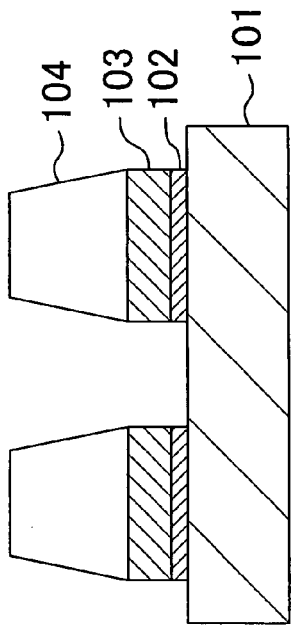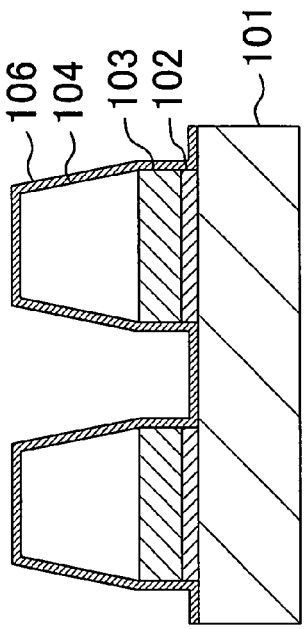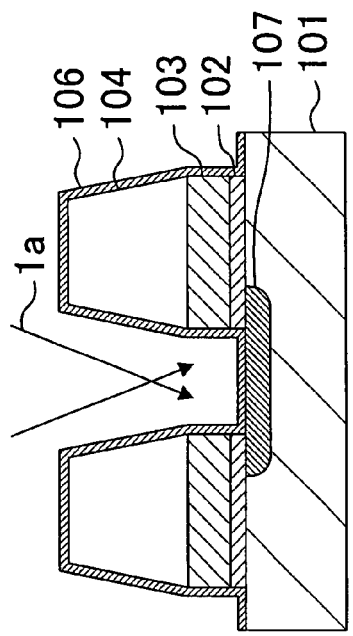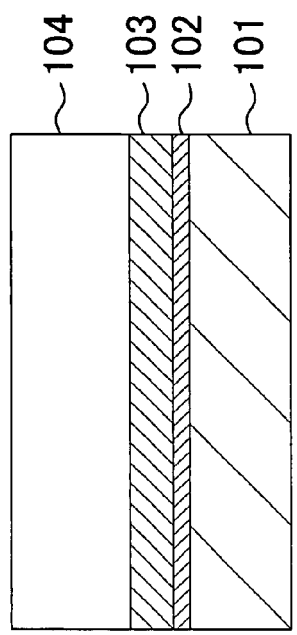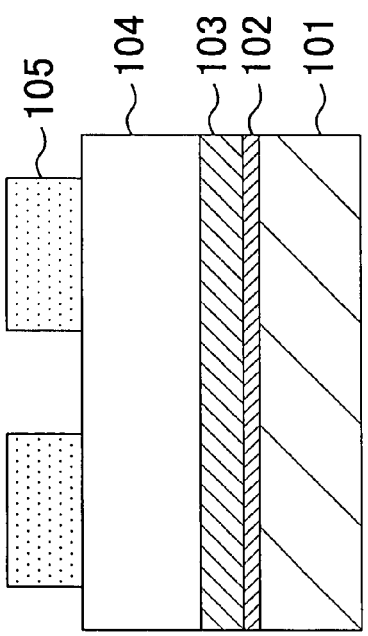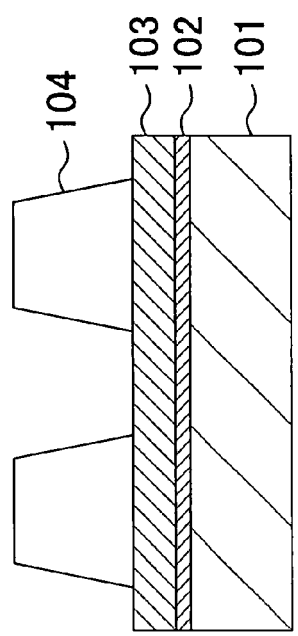

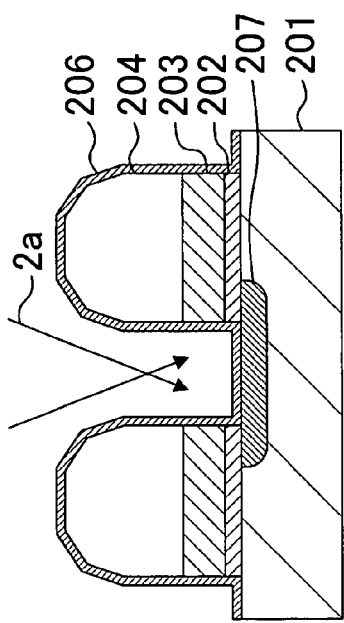
FIG.5A
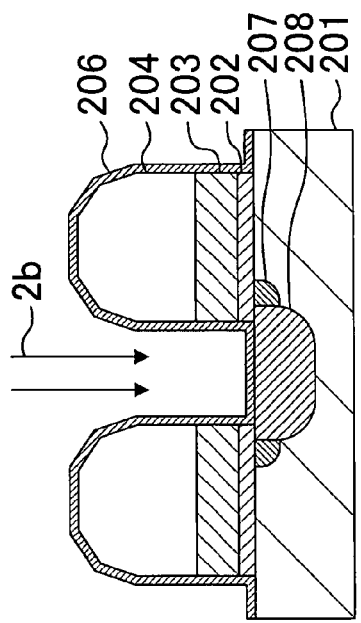
FIG.5B
FIG.5C
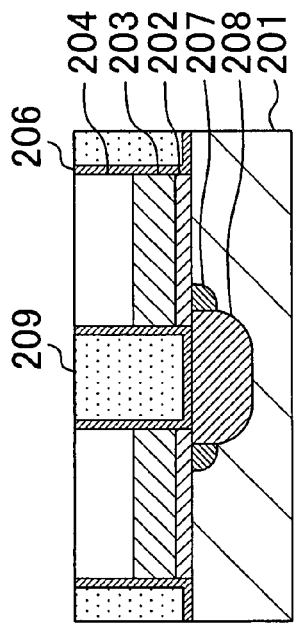
FIG.5D
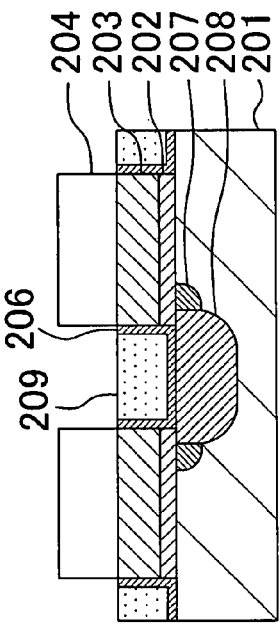
FIG.5E
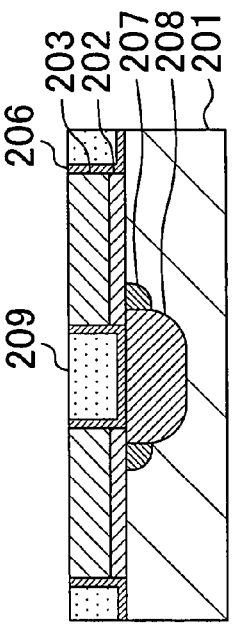
FIG.5F
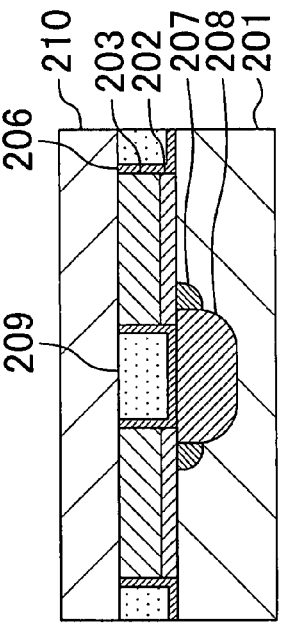
FIG.5G
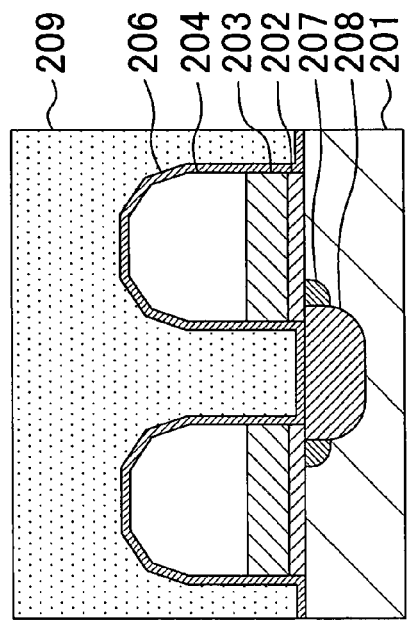

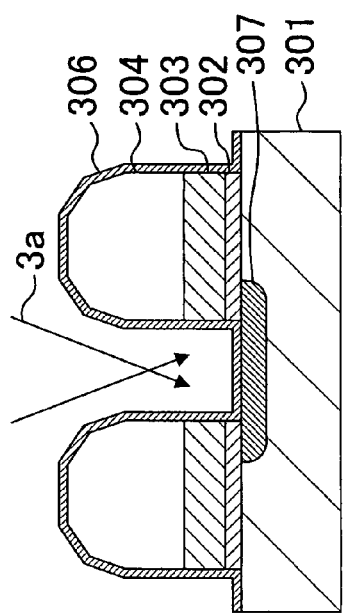
FIG.7A
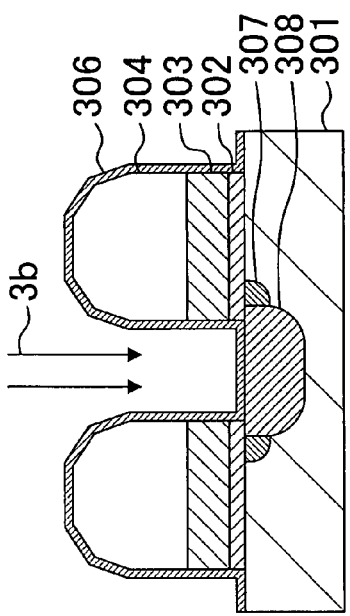
FIG.7B
FIG.7C
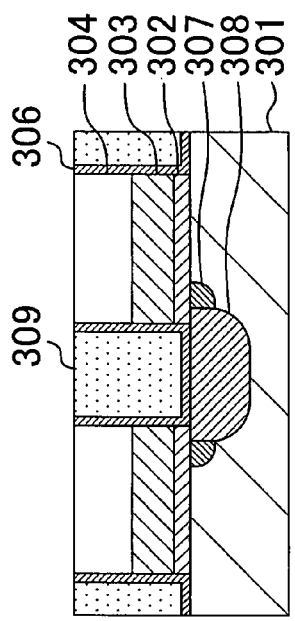
FIG.7D
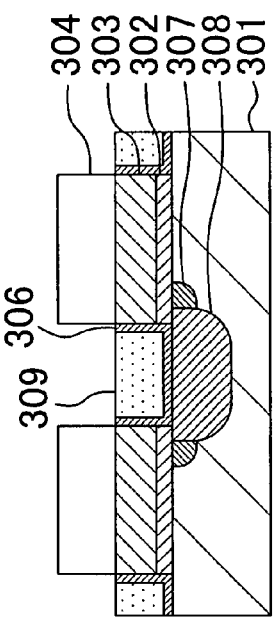
FIG.7E
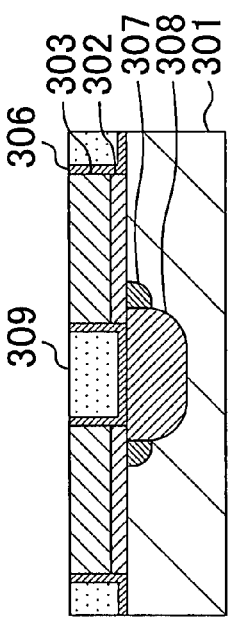
FIG.7F
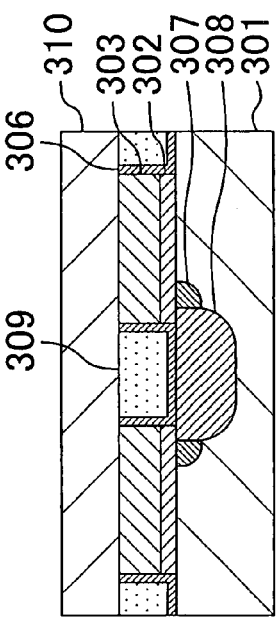
FIG.7G ent invention is to provide a method of fabricating a
METHOD OF FABRICATING NONVOLATILE SEMICONDUCTOR MEMORY DEVICE

BACKGROUND OF THE INVENTION

1. Field of the Invention

The present invention relates to a method of fabricating a nonvolatile semiconductor memory device having a virtual ground array configuration.

2. Description of the Prior Art

In recent years, a nonvolatile semiconductor memory device having a virtual ground array configuration is a subject of interest as the technology of realizing high integration.

FIG. 10A through FIG. 10C are cross-sectional views illustrating steps in a method of fabricating a nonvolatile semiconductor memory device of a first background art (for example, see U.S. Pat. No. 6,803,284).

As illustrated with FIG. 10A, over a silicon substrate 601 having device isolation regions 600, a charge trapping layer 602, a first polysilicon film 603, and a silicon nitride film 604 are sequentially deposited. Then, the silicon nitride film 604 and the first polysilicon film 603 are selectively etched. Using the silicon nitride film 604 and the first polysilicon film 603 as a mask, bit line diffusion layers 608 are formed.

Next, as illustrated with FIG. 10B, a dielectric layer (not shown) is formed, and then polished by performing CMP. As a result, regions from which the silicon nitride film 604 and the first polysilicon film 603 are removed are filled with an insulation film 609.

Next, as illustrated with FIG. 10C, the silicon nitride film 604 is removed, and then a second polysilicon film 610 is formed.

FIG. 11A through FIG. 11C are cross-sectional views illustrating steps in a method of fabricating a nonvolatile semiconductor memory device of a second background art (for example, see U.S. Pat. No. 6,482,706).

It is not disclosed in the first background art but is generally known that pocket implantation is performed for the purposes of suppressing a short-channel effect and effectively producing hot carriers. The pocket implantation is performed in a region closer to a channel than the bit line diffusion layer is to the channel. The pocket implantation is opposite in conductivity type to bit line implantation. The method of forming a pocket implantation layer is disclosed in the second background art.

As illustrated with FIG. 11A, over a silicon substrate 701, a charge trapping layer 702 having a layered configuration and a first polysilicon film 703 are sequentially formed. Then, the first polysilicon film 703 is selectively etched. Using the first polysilicon film 703 as a mask, ion implantation 704 is performed to form pocket implantation layers 705.

Next, as illustrated with FIG. 11B, on a side surface of the first polysilicon film 703, a spacer 706 is formed. Then, using the first polysilicon film 703 and the spacer 706 as a mask, ion implantation 707 is performed to form bit line diffusion layers 708.

However, the nonvolatile semiconductor memory device according to the background arts has a problem that suppression of the short-channel effect in a miniaturized device is difficult.

In order to suppress the short-channel effect, it is necessary to form the pocket implantation layer closer to the channel than the bit line diffusion layer is to the channel. For that purpose, it is conceivable that the bit line diffusion layer is formed after the spacer is formed as disclosed in the second background art. However, in this case, the distance between bit lines has to be increased by the spacer to realize the same resistance for each bit line.

As another art for forming the pocket implantation layer closer to the channel than the bit line diffusion layer is to the channel, it is generally known to perform pocket implantation at an angle. In this case, an identical mask is used to perform pocket implantation at an angle of 25 degrees and to perform bit line implantation perpendicularly, which realizes a desired profile.

However, when pocket implantation is performed at an angle, the implantation is not performed in a later-described "shadow" region between adjacent gate electrodes. Therefore, an implantation angle may not be greatly increased, with the "shadow" region being ignored. In the first background art, the "shadow" region expands as the total height of the first polysilicon film 603 and the silicon nitride film 604 increases, and the size of a region acceptable as the "shadow" region reduces as the distance between adjacent first polysilicon films 603 narrows due to miniaturization.

FIG. 12 is a partially enlarged view which illustrates a cross sectional configuration of the first background art and with reference to which influence of the "shadow" region in the case of pocket implantation performed at an angle is described.

It is assumed that the distance between the adjacent first polysilicon films 603 is s, the length of the "shadow" region is x, the total height of the charge trapping layer 602, the first polysilicon film 603, and the silicon nitride film 604 is h, an implantation angle along a normal direction to a principal plane of the semiconductor substrate 601 is 0°, and an implantation angle inclined from the normal direction is θ. In this case, relational expressions as follows are to hold true.

$$s > x$$

$$x = h \cdot \tan(90-\theta) = h/\tan(\theta)$$

According to the relational expressions, the problem of reducing the "shadow" region may be solved by lowering the total height h of the charge trapping layer 602, the first polysilicon films 603, and the silicon nitride film 604. However, since the silicon nitride film 604 is used later as a stopper film in the step of polishing by CMP, the silicon nitride film 604 is required to have a film thickness of about 100 nm to about 200 mm. Therefore, even if miniaturization is performed, the film thickness of the silicon nitride film 604 may not be reduced. In other words, even if miniaturization is performed, the length x of the "shadow" does not change, and thus the distance s between the adjacent first polysilicon films 603 can not be reduced.

As described above, the nonvolatile semiconductor memory device of the background arts has a problem that suppression of the short-channel effect in a miniaturized device is difficult.

SUMMARY OF THE INVENTION

In view of the above-mentioned problems, an object of the present invention is to provide a method of fabricating a nonvolatile semiconductor memory device having a virtual ground array configuration, wherein a "shadow" region in a case of pocket implantation at an angle is reduced, and a short-channel effect in a miniaturized device is suppressed.

To achieve the object, a method of fabricating a nonvolatile semiconductor memory device of according to a first configuration of the present invention is a method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines, the method including the steps of: (a) forming a layered dielectric film on the semiconductor substrate; (b) forming a first conductive film on the layered dielectric film; (c) forming a first dielectric film on the first conductive film; (d) patterning the first dielectric film and the first conductive film such that first dielectric films and first conductive films are left side by side in the column direction to form a layered pattern composed of the first dielectric films and the first conductive films; and (e) performing first impurity implantation to form a first impurity diffusion layer being the same in conductivity type as the semiconductor substrate, the first impurity implantation being performed along a direction having an inclination angle to a normal direction to a principal plane of the semiconductor substrate by using the layered pattern as a mask, wherein, step (d) includes patterning the first dielectric film to form the first dielectric films having a shape with a width narrower in an upper surface than in a lower surface.

According to the method of fabricating a nonvolatile semiconductor memory device of the first configuration of the present invention, after the first dielectric film is patterned to form first dielectric films having a shape with width narrower in an upper surface than in a lower surface, first impurity implantation is performed along a direction having an inclination angle to a normal direction to a principal plane of the semiconductor substrate to form the first impurity diffusion layer. Therefore, the "shadow" region in the case of the relevant implantation can be reduced. This makes it possible to easily realize miniaturization and suppression of a short-channel effect concurrently.

The method of fabricating a nonvolatile semiconductor memory device of the first configuration of the present invention further includes the step of: (f) after step (d), performing second impurity implantation to form a second impurity diffusion layer having a conductivity type opposite to that of the semiconductor substrate, the second impurity implantation being performed along the normal direction to the principal plane of the semiconductor substrate by using the patterned first dielectric films and the patterned first conductive films as a mask.

According to this method, it is possible to increase the distance between the first impurity diffusion layer and the second impurity diffusion layer.

The method of fabricating a nonvolatile semiconductor memory device of the first configuration of the present invention further includes the step of: (g) after steps (e) and (f), filling a second dielectric film in regions from which the first dielectric film and the first conductive film are removed in the patterning.

In this way, it is possible to effectively insulate between the first conductive films.

The method of fabricating a nonvolatile semiconductor memory device of the first configuration of the present invention further includes after step (g), the steps of: (h) removing the first dielectric films to expose surfaces of the first conductive films; (i) forming a second conductive film such that the second conductive film is directly in contact with the exposed surfaces of the first conductive films and covers the second dielectric film; and (j) patterning the second conductive film by selective etching such that second conductive films are left side by side in the row direction.

In this way, it is possible to connect the first conductive films with each other and form the word lines.

In the method of fabricating a nonvolatile semiconductor memory device of the first configuration of the present invention, step (d) includes: (da1) patterning the first dielectric film by selective etching such that the first dielectric films having the shape with a width narrower in an upper surface than in a lower surface are left side by side in the column direction; and (da2) after step (da1), patterning the first conductive film to form the first conductive films having a substantially vertical shape by using the patterned first dielectric films as a mask.

In this way, it is also possible to form the first dielectric films which are left side by side in the column direction and which have a shape with width narrower in an upper surface than in a lower surface in one identical step.

In the method of fabricating a nonvolatile semiconductor memory device of the first configuration of the present invention, step (d) includes the steps of: (db1) patterning the first dielectric film by selective etching such that the first dielectric films are left side by side in the column direction; (db2) after step (db1), etching the first dielectric films to have the shape with a width narrower in an upper surface than in a lower surface; and (db3) after step (db2), patterning the first conductive film to form the first conductive films having a substantially vertical shape by using the etched first dielectric films as a mask.

In this method, if an etching condition having a high selection ratio between the first dielectric film and the first conductive film is adopted, it is possible to certainly perform the process of etching the first dielectric films to have the shape with a width narrower in an upper surface than in a lower surface.

In the method of fabricating a nonvolatile semiconductor memory device of the first configuration of the present invention, step (d) includes the steps of: (dc1) patterning the first dielectric film by selective etching such that the first dielectric films are left side by side in the column direction; (dc2) after step (dc1), patterning the first conductive film to form the first conductive films having a substantially vertical shape by using the patterned first dielectric films as a mask; and after step (dc2), etching the first dielectric films into the shape with a width narrower in an upper surface than in a lower surface.

In this way, the layered dielectric film can be etched simultaneously in step (dc2), and thus the simplification of the step is possible.

In the method of fabricating a nonvolatile semiconductor memory device of the first configuration of the present invention, the layered dielectric film includes a charge trapping film.

In this way, it is possible to stably trap charges.

A method of fabricating a nonvolatile semiconductor memory device of a second configuration of the present invention is a method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines, the method comprising the steps of: (k) forming a tunnel dielectric film on the semiconductor substrate; (l) forming a first conductive film on the tunnel dielectric film; (m) forming a first dielectric film on the first conductive film; (n) patterning the first dielectric film by selective etching such that first dielectric films are left side by side in the column direction; (o) patterning the first conductive film to form conductive films having a substantially vertical shape by etching using the patterned first dielectric films as a mask; (p) performing first impurity implantation to form a first impurity diffusion layer having the same conductivity type as that of the semiconductor substrate, the first impurity implantation being performed along a direction having an inclination angle to a normal direction to a principal plane of the semiconductor substrate by using the patterned first dielectric films and the patterned first conductive films as a mask; (q) performing second impurity implantation to form a second impurity diffusion layer having a conductivity type opposite to that of the semiconductor substrate, the second impurity implantation being performed along the normal direction to the principal plane of the semiconductor substrate by using the patterned first dielectric films and the patterned first conductive films as a mask; (r) after steps (p) and (q), filling a second dielectric film in regions from which the first dielectric film and the first conductive film are removed in the patterning; (s) after step (r), removing the first dielectric films to expose surfaces of the first conductive films; (t) forming a layered dielectric film to cover the exposed surfaces of the first conductive films and the second dielectric film; and (u) forming a second conductive film on the layered dielectric film, wherein step (n) includes patterning the first dielectric film to form first dielectric films having a shape with a width narrower in an upper surface than in a lower surface.

According to the method of fabricating a nonvolatile semiconductor memory device of the second configuration of the present invention, after the first dielectric film is patterned to form first dielectric films having a shape with width narrower in an upper surface than in a lower surface, first impurity implantation is performed along a direction having an inclination angle to a normal direction to a principal plane of the semiconductor substrate to form the first impurity diffusion layer. Therefore, the "shadow" region in the case of the relevant implantation can be reduced. This makes it possible to easily realize miniaturization and suppression of a short-channel effect concurrently.

In the method of fabricating a nonvolatile semiconductor memory device of the second configuration of the present invention, the layered dielectric film is composed of a silicon oxide film, a silicon nitride film, and a silicon oxide film formed in this order from the bottom.

In this way, it is possible to improve reliability of the inter-electrode dielectric film serving as a trapping film.

In the methods of fabricating the nonvolatile semiconductor memory devices of the first and second configurations of the present invention, the shape with a width narrower in an upper surface than in a lower surface of the first dielectric films is a normally tapered shape.

In the methods of fabricating the nonvolatile semiconductor memory devices of the first and second configurations of the present invention, the shape with a width narrower in an upper surface than in a lower surface of the first dielectric films is a shape of a rounded upper part of the first dielectric films.

As described above, according to the method of fabricating the nonvolatile semiconductor memory device of the present invention, it is possible to reduce the "shadow" region in the case of pocket implantation performed at an angle in a method of fabricating a nonvolatile semiconductor memory device having a virtual ground array configuration. Therefore, it possible to easily realize miniaturization and suppression of a short-channel effect concurrently.

BRIEF DESCRIPTION OF THE DRAWINGS

FIG. 1A through FIG. 1F are cross-sectional views illustrating steps in a method of fabricating a nonvolatile semiconductor memory device of Embodiment 1 of the present invention.

FIG. 5A through FIG. 5G are cross-sectional views illustrating steps in the method of fabricating the nonvolatile semiconductor memory device of Embodiment 2 of the present invention.

FIG. 7A through FIG. 7G are cross-sectional views illustrating steps in the method of fabricating the nonvolatile semiconductor memory device of Embodiment 3 of the present invention.

DESCRIPTION OF THE PREFERRED EMBODIMENTS

Figure 2A:
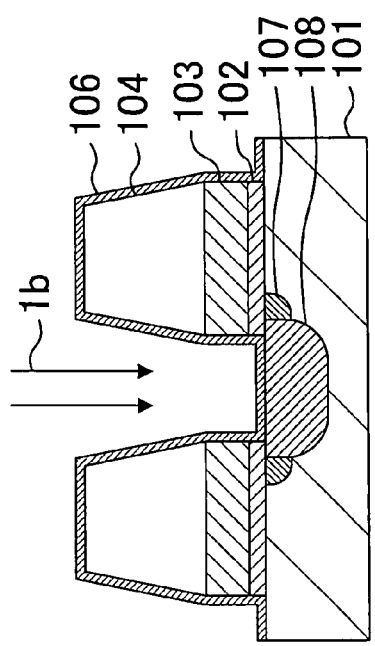
FIG. 2A through FIG. 2F are cross-sectional views illustrating steps in the method of fabricating the nonvolatile semiconductor memory device of Embodiment 1 of the present invention.

Embodiments of the present invention will be described with reference to the drawings below.

In the following Embodiments of the present invention, descriptions are given of a method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines.

Embodiment 1

A nonvolatile semiconductor memory device of Embodiment 1 of the present invention will be described below with reference to FIG. 1A through FIG. 1F and FIG. 2A through FIG. 2F.

FIG. 1A through FIG. 1F and FIG. 2A through FIG. 2F are cross-sectional views illustrating steps in a method of fabricating the nonvolatile semiconductor memory device of Embodiment 1 of the present invention.

First, as illustrated with FIG. 1A, on a semiconductor substrate 101, a lower oxide film having a film thickness of 5 nm, a silicon nitride film having a film thickness of 5 nm and an upper oxide film having a film thickness of 7 nm are sequentially formed to provide a layered dielectric film 102. Then, on the layered dielectric film 102, a lower polysilicon film 103 having a film thickness of 40 nm and a silicon nitride film 104 having a film thickness of 150 nm are sequentially formed.

Next, as illustrated with FIG. 1B, on the silicon nitride film 104, photoresist 105 is applied, and then the photoresist 105 in desired regions is removed.

Then, as illustrated with FIG. 1C, the silicon nitride film 104 is etched to form silicon nitride films 104 having side surfaces in a normally tapered shape at about 85° (the hereinafter-mentioned shape of the side surfaces of the silicon nitride films 104 refers to a shape viewed from above). In this case, etching is performed under such a condition that for example, the flow rate of a $CF_4$ gas is $150 \times 10^{-3}$ (ml/min), the flow rate of a $CHF_3$ gas is $170 \times 10^{-3}$ (ml/min), the flow rate of an $O_2$ gas is $6 \times 10^{-3}$ (ml/min), the pressure is 8 (Pa), the upper electrode power is 550 (W), the lower electrode power is 500 (W), and the period is 120 seconds. Then the photoresist 105 is removed.

Next, as illustrated with FIG. 1D, using the silicon nitride films 104 as a mask, the polysilicon film 103 and the layered dielectric film 102 in desired regions are sequentially removed by etching to expose the semiconductor substrate 101. At this moment, a space between polysilicon films 103 adjacent to each other with the semiconductor substrate 101 being exposed therebetween is 80 nm for example.

Next, as illustrated with FIG. 1E, an implantation protection film 106 is formed to cover the silicon nitride films 104. The implantation protection film 106 is formed by a silicon oxide film and has a film thickness of 5 nm.

Next, as illustrated with FIG. 1F, ion implantation 1a of, for example, $B^+$ is performed along a direction having an inclination angle inclined by 25° from a normal direction to a principal plane of the semiconductor substrate 101 to form a pocket implantation layer 107. In this case, the ion implantation 1a is performed under the condition of the implantation energy of 20 keV and $2 \times 10^{13}$ atoms/$cm^{-2}$.

Then, as illustrated with FIG. 2A, ion implantation 1b of, for example, $As^+$ is performed substantially along the normal direction to the principal surface of the semiconductor substrate 101 to form a bit line diffusion layer 108. In this case, the ion implantation 1b is performed under the condition of the implantation energy of 50 keV and $2 \times 10^{15}$ atoms/$cm^{-2}$.

Figure 2B:
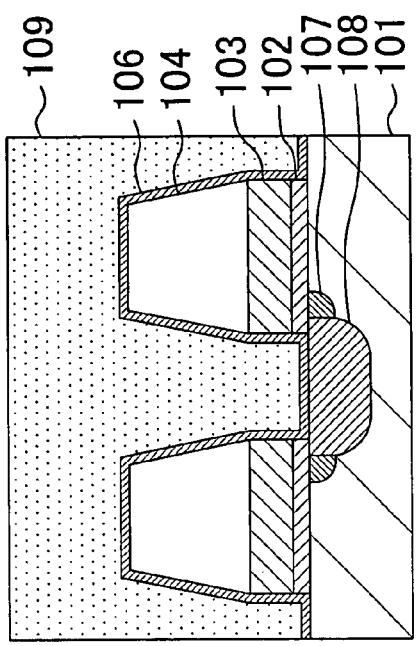

Then, as illustrated with FIG. 2B, on the implantation protection film 106, a buried dielectric film 109 of a silicon oxide film is formed by high-density plasma CVD.

Figure 2C:
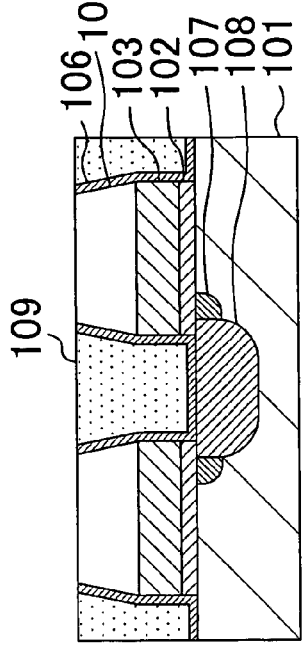

Then, as illustrated with FIG. 2C, polishing is performed by CMP until the silicon nitride films 104 are exposed. In this case, it is preferable that the silicon nitride films 104 are over-polished as shown in FIG. 2C. This provides a shape having a smooth surface without residue.

Figure 2D:
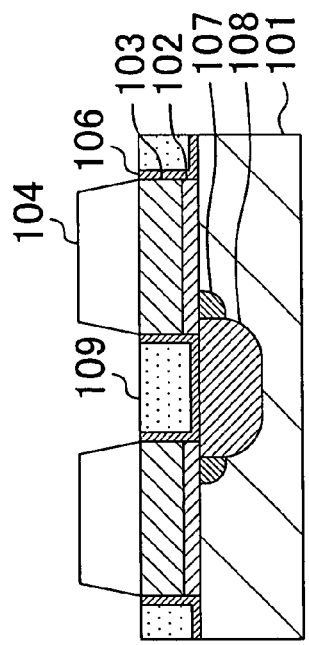

Then, as illustrated with FIG. 2D, using hydrofluoric acid, an upper part of the buried dielectric film is removed by etching to adjust the height.

Figure 2E:
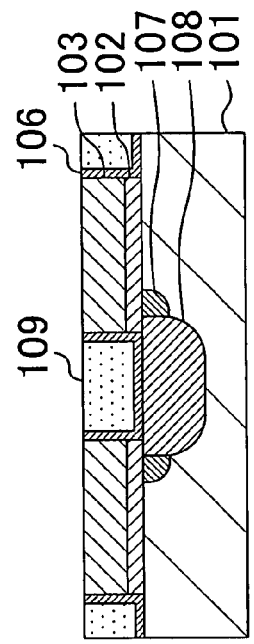

Then, as illustrated with FIG. 2E, the silicon nitride films 104 are removed to expose surfaces of the lower polysilicon films 103.

Figure 2F:
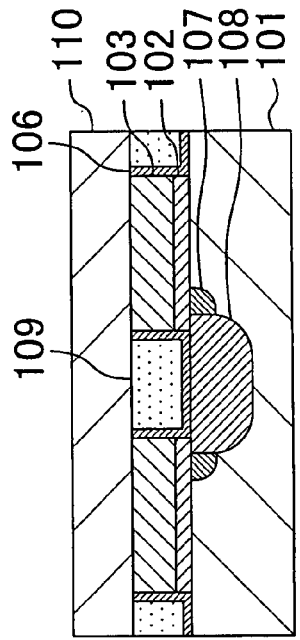

Then, as illustrated with FIG. 2F, an upper polysilicon film 110 is formed in contact with the lower polysilicon films 103. Then, the upper polysilicon film 110 is patterned to be a desired shape forming word lines.

According to the above-mentioned method of fabricating the nonvolatile semiconductor memory device of the present embodiment, the silicon nitride films 104 having side surfaces in a tapered shape are formed, and then pocket implantation is performed at an angle. Therefore, the "shadow" region in the case of pocket implantation performed at an angle can be reduced. Accordingly, even if the space between the polysilicon films 103 adjacent to each other is small, the pocket implantation can be performed at an implantation angle greatly inclined from the normal to the principal plane of the semiconductor substrate 101.

Here, using a formula, it is described below to what degree an angle of the normally tapered shape of the side surface of silicon nitride film 104 is to be set.

Figure 3:
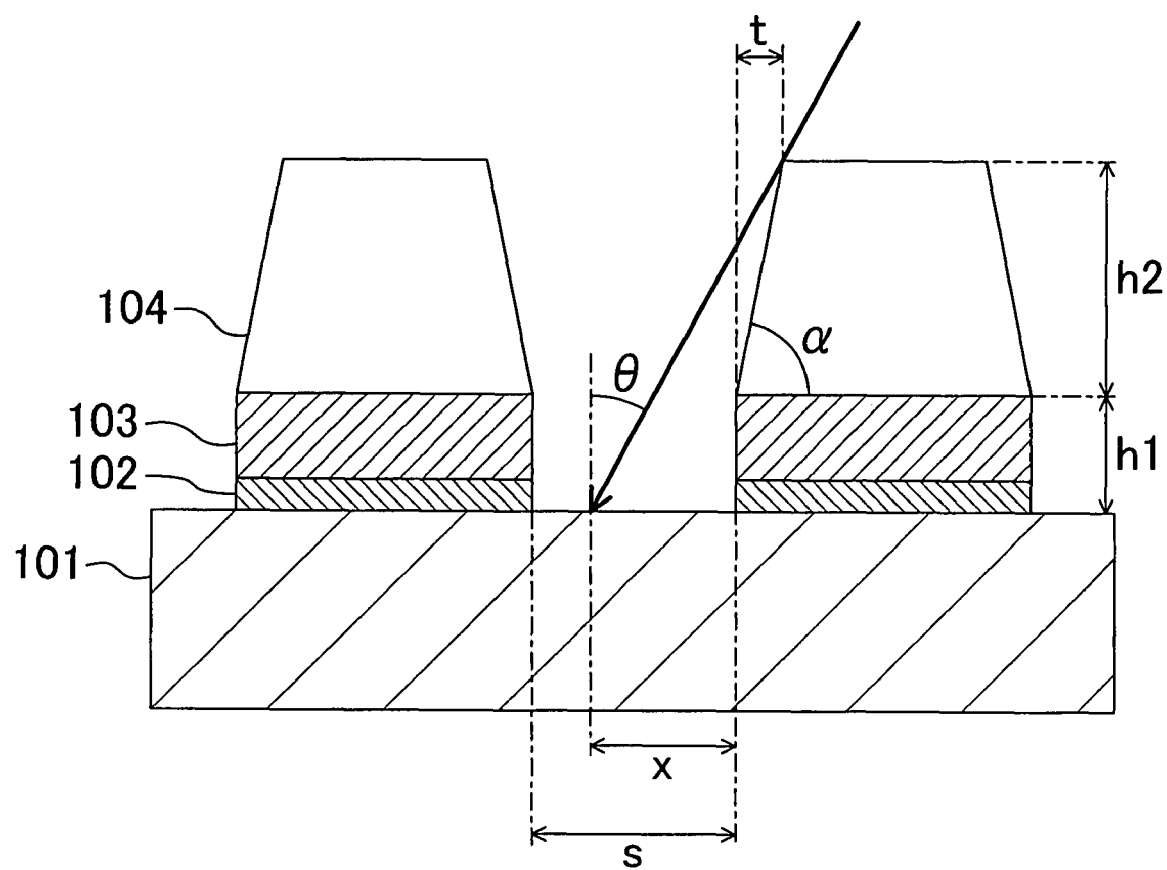
FIG. 3 is a cross-sectional view with which a taper angle of the method of fabricating the nonvolatile semiconductor memory device of Embodiment 1 of the present invention is described.

FIG. 3 is a partially enlarged view which illustrates the cross sectional configuration of FIG. 1D and with which a degree of an angle of the normally tapered shape of the side surface of the silicon nitride film 104 in the case of pocket implantation performed at an angle according to Embodiment 1 of the present invention is described.

It is assumed that the distance between the lower polysilicon films 103 adjacent to each other is s, the film thickness from a surface of the semiconductor substrate 101 to the upper surface of the lower polysilicon film 103 is h1, the film thickness of the silicon nitride film 104 is h2, the taper angle of the silicon nitride film 104 is α, the implantation angle along the normal direction to the principal plane of the semiconductor substrate 101 is 0°, the implantation angle inclined from the normal direction is θ, and the difference between an upper size and an lower size of the silicon nitride film 104 due to the tapered shape of the silicon nitride film 104 is t.

In this case, relational expressions as follows hold true.

$s > x$ $t = h2 \cdot \tan(90 - \alpha) = h2/\tan(\alpha)$ $x = (h1 + h2) \cdot \tan(\theta) - t$ These expressions are reduced to as follows.

$\tan(\alpha) < h2/[(h1 + h2)\tan(\theta) - s]$

Therefore, the taper angle α is as follows.

$\alpha < \tan^{-1}[h2/\{(h1 + h2)\tan(\theta) - s\}]$

When h1 is 50 nm, h2 is 150 nm, s is 80 nm, and θ is 25°, α is smaller than 84.9°. Compared to this, if the normally tapered shape is not formed, that is, if α is 90°, and h1, h2, and θ respectively have the above-mentioned values, s is longer than 93.3 nm. Therefore, if the taper angle α is set to 84.9°, it is possible to obtain an effect that the space between the lower polysilicon films 103 adjacent to each other can be reduced by 13.3 nm.

As described above, according to the method of fabricating a nonvolatile semiconductor memory device of Embodiment 1 of the present invention, it is possible to easily realize miniaturization and suppression of a short-channel effect concurrently.

Embodiment 2

A nonvolatile semiconductor memory device of Embodiment 2 of the present invention will be described below with reference to FIG. 4A through FIG. 4F and FIG. 5A through FIG. 5G.

FIG. 4A through FIG. 4F and FIG. 5A through FIG. 5G are cross-sectional views illustrating steps in a method of fabricating the nonvolatile semiconductor memory device of Embodiment 2 of the present invention.

Figure 4A:
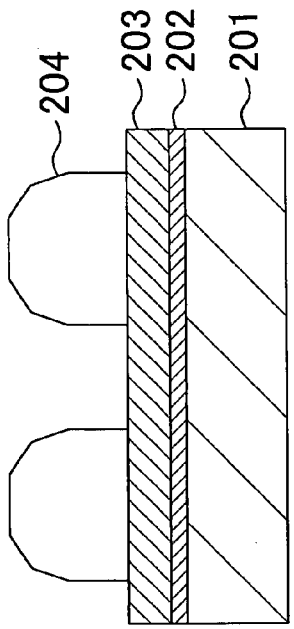
FIG. 4A through FIG. 4F are cross-sectional views illustrating steps in a method of fabricating a nonvolatile semiconductor memory device of Embodiment 2 of the present invention.

First, as illustrated with FIG. 4A, on a semiconductor substrate 201, a lower oxide film having a film thickness of 5 nm, a silicon nitride film having a film thickness of 5 nm and an upper oxide film having a film thickness of 7 nm are sequentially formed to provide a layered dielectric film 202. Then, on the layered dielectric film 202, a lower polysilicon film 203 having a film thickness of 40 nm and a silicon nitride film 204 having a film thickness of 150 nm are sequentially formed.

Figure 4B:
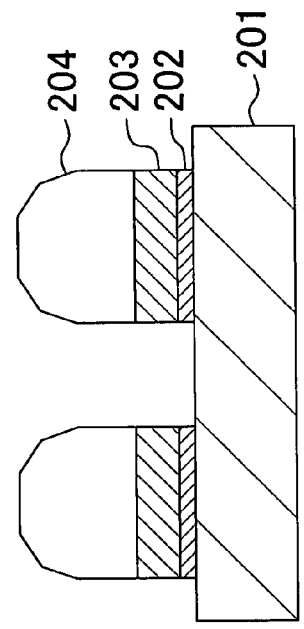

Next, as illustrated with FIG. 4B, on the silicon nitride film 204, photoresist 205 is applied, and then the photoresist 205 in desired regions is removed.

Figure 4C:
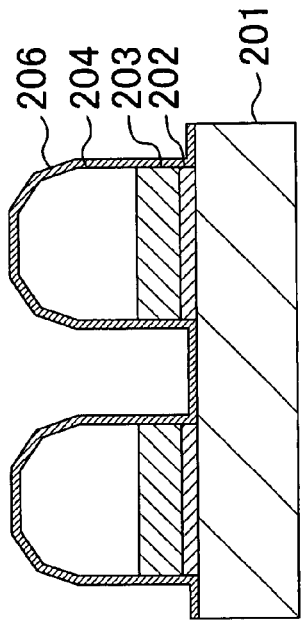

Then, as illustrated with FIG. 4C, the silicon nitride film 204 is etched to form silicon nitride films 204 having a substantially vertical shape. In this case, etching is performed under such a condition that for example, the flow rate of a $CF_4$ gas is $250 \times 10^{-3}$ (ml/min), the flow rate of a $CHF_3$ gas is $70 \times 10^{-3}$ (ml/min), the flow rate of an $O_2$ gas is $30 \times 10^{-3}$ (ml/min), the pressure is 8 (Pa), the upper electrode power is 550 (W), the lower electrode power is 500 (W), and the period is 120 seconds. Then, the photoresist 205 is removed.

Figure 4D:
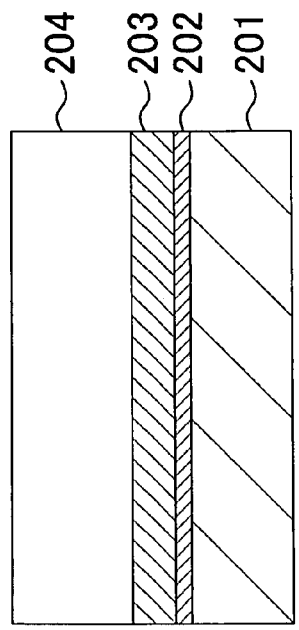

Then, as illustrated with FIG. 4D, over-etching is performed such that an upper part of each silicon nitride film 204 has a rounded shape. In this case, the over-etching is performed under such a condition that the flow rate of a $CF_4$ gas is $50 \times 10^{-3}$ (ml/min), the flow rate of a $CHF_3$ gas is $150 \times 10^{-3}$ (ml/min), the flow rate of an Ar gas is $1000 \times 10^{-3}$ (ml/min), the pressure is 13 (Pa), the upper electrode power is 500 (W), the lower electrode power is 260 (W), and the period is 30 seconds.

Figure 4E:
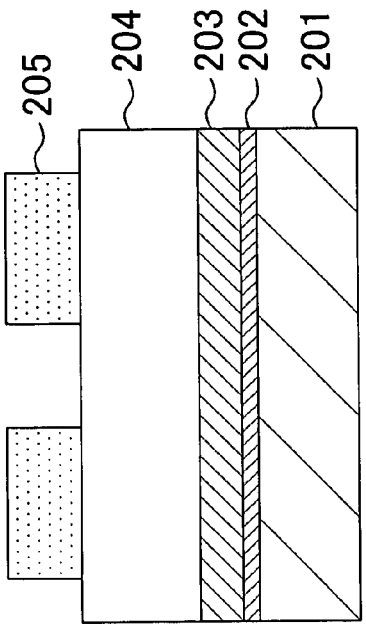

Next, as illustrated with FIG. 4E, using the silicon nitride films 204 as a mask, the polysilicon film 203 and the layered dielectric film 202 in desired regions are sequentially removed by etching to expose the semiconductor substrate 201. At this moment, a space between polysilicon films 203 adjacent to each other with the semiconductor substrate 201 being exposed therebetween is 80 nm for example.

Figure 4F:
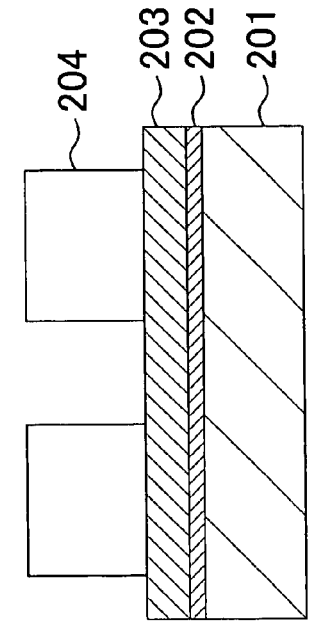

Next, as illustrated with FIG. 4F, an implantation protection film 206 is formed to cover the silicon nitride films 204. The implantation protection film 206 is formed by a silicon oxide film and has a film thickness of 5 nm.

Next, as illustrated with FIG. 5A, ion implantation 2a of, for example, $B^+$ is performed along a direction having an implantation angle inclined by 25° from a normal direction to a principal plane of the semiconductor substrate 201 to form a pocket implantation layer 207. In this case, the ion implantation 2a is performed under the condition of the implantation energy of 20 keV and $2 \times 10^{13}$ atoms/cm$^{-2}$.

Then, as illustrated with FIG. 5B, ion implantation 2b of, for example, $As^+$ is performed substantially along the normal direction to the principal surface of the semiconductor substrate 201 to form a bit line diffusion layer 208. In this case, the ion implantation 2b is performed under the condition of the implantation energy of 50 keV and $2 \times 10^{15}$ atoms/cm$^{-2}$.

Then, as illustrated with FIG. 5C, on the implantation protection film 206, a buried dielectric film 209 of a silicon oxide film is formed by high-density plasma CVD.

Then, as illustrated with FIG. 5D, polishing is performed by CMP until the silicon nitride films 204 are exposed. In this case, it is preferable that the silicon nitride films 204 are over-polished as shown in FIG. 5D. This provides a shape having a smooth surface without residue.

Then, as illustrated with FIG. 5E, using hydrofluoric acid, an upper part of the buried dielectric film is removed by etching to adjust the height.

Then, as illustrated with FIG. 5F, the silicon nitride films 204 are removed to expose surfaces of the lower polysilicon films 203.

Then, as illustrated with FIG. 5G, an upper polysilicon film 210 is formed in contact with the lower polysilicon films 203. Then, the upper polysilicon film 210 is patterned to be a desired shape forming word lines.

According to the above-mentioned method of fabricating the nonvolatile semiconductor memory device of the present embodiment, the upper part of each silicon nitride film 204 is first formed into a rounded shape, and then pocket implantation is performed at an angle. Therefore, the "shadow" region in the case of pocket implantation performed at an angle can be reduced. Accordingly, even if the space between the polysilicon films 203 adjacent to each other is small, the pocket implantation can be performed at an implantation angle greatly inclined from the normal to the principal plane of the semiconductor substrate 201. This makes it possible to easily realize miniaturization and suppression of a short-channel effect concurrently.

In the present embodiment, the upper part of each silicon nitride film 204 has a rounded shape. However, approximation is possible by, as a standard, using the film thickness to the surface of the semiconductor substrate 101 from a position on the side surface of the silicon nitride film 204 from which rounding starts as a value of h1, and using the film thickness to an upper surface of the silicon nitride film 204 from the position on the side surface of the silicon nitride film 204 from which rounding starts as a value of h2 in the expressions of Embodiment 1.

Embodiment 3

A nonvolatile semiconductor memory device of Embodiment 3 of the present invention will be described below with reference to FIG. 6A through FIG. 6F and FIG. 7A through FIG. 7G.

FIG. 6A through FIG. 6F and FIG. 7A through FIG. 7G are cross-sectional views illustrating steps in a method of fabricating the nonvolatile semiconductor memory device of Embodiment 3 of the present invention.

Figure 6A:
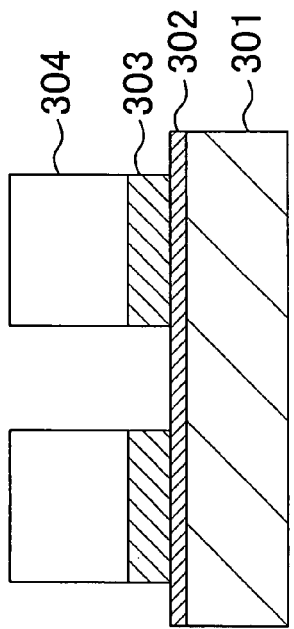
FIG. 6A through FIG. 6F are cross-sectional views illustrating steps in a method of fabricating a nonvolatile semiconductor memory device of Embodiment 3 of the present invention.

First, as illustrated with FIG. 6A, on a semiconductor substrate 301, a lower oxide film having a film thickness of 5 nm, a silicon nitride film having a film thickness of 5 nm and an upper oxide film having a film thickness of 7 nm are sequentially formed to provide a layered dielectric film 302. Then, on the layered dielectric film 302, a lower polysilicon film 303 having a film thickness of 40 nm and a silicon nitride film 304 having a film thickness of 150 nm are sequentially formed.

Figure 6B:
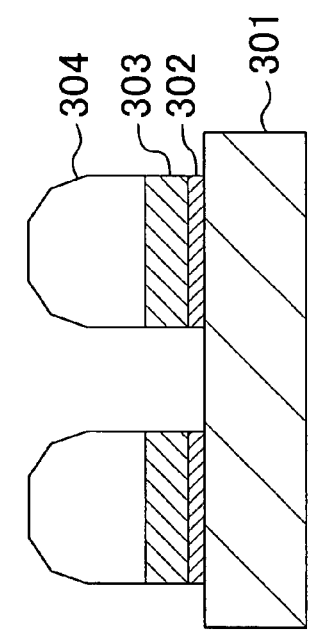

Next, as illustrated with FIG. 6B, on the silicon nitride film 304, photoresist 305 is applied, and then the photoresist 305 in desired regions is removed.

Figure 6C:
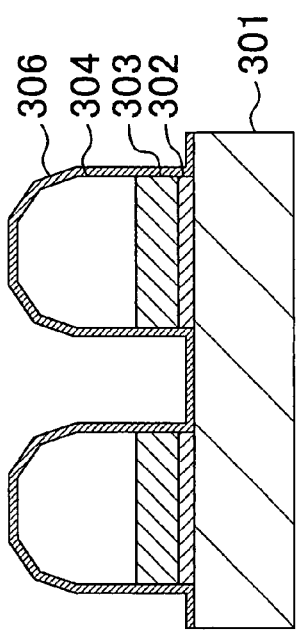

Then, as illustrated with FIG. 6C, the silicon nitride film 304 is etched to form silicon nitride films 304 having a substantially vertical shape. In this case, etching is performed under such a condition that for example, the flow rate of a $CF_4$ gas is $250 \times 10^{-3}$ (ml/min), the flow rate of a $CHF_3$ gas is $70 \times 10^{-3}$ (ml/min), the flow rate of an $O_2$ gas is $30 \times 10^{-3}$ (ml/min), the pressure is 8 (Pa), the upper electrode power is 550 (W), the lower electrode power is 500 (W), and the period is 120 seconds. Then the photoresist 305 is removed.

Figure 6D:
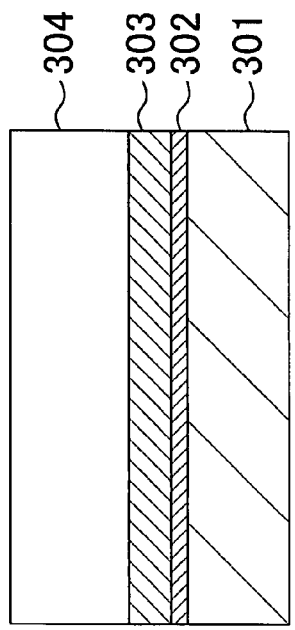

Next, as illustrated with FIG. 6D, using the silicon nitride films 304 as a mask, the polysilicon film 303 is removed by etching to expose the layered dielectric film 302. At this moment, a space between polysilicon films 303 adjacent to each other with the semiconductor substrate 301 being exposed therebetween is 80 nm for example.

Figure 6E:
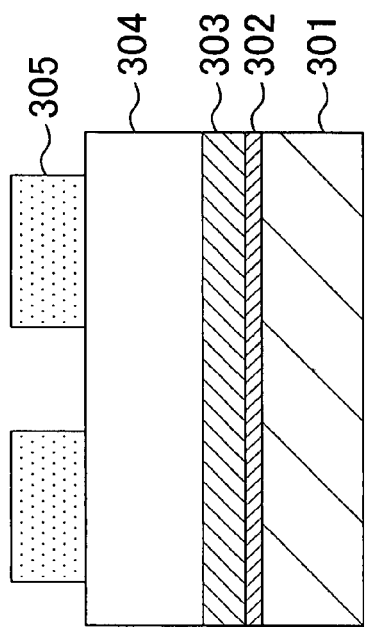

Then, as illustrated with FIG. 6E, over-etching is performed such that an upper part of each silicon nitride film 304 has a rounded shape. Simultaneously with the over-etching, the layered dielectric film 302 is removed. In this case, the over-etching and the removal are performed under such a condition that the flow rate of a $CF_4$ gas is $50 \times 10^{-3}$ (ml/min), the flow rate of a $CHF_3$ gas is $150 \times 10^{-3}$ (ml/min), the flow rate of an Ar gas is $1000 \times 10^{-3}$ (ml/min), the pressure is 13 (Pa), the upper electrode power is 500 (W), the lower electrode power is 260 (W), and the period is 30 seconds. In this way, it is possible to unify the step of rounding the upper part of each silicon nitride film 304 and the step of removing the layered dielectric film 302. Therefore, compared to Embodiment 2 mentioned above, it is possible to simplify the step.

Figure 6F:
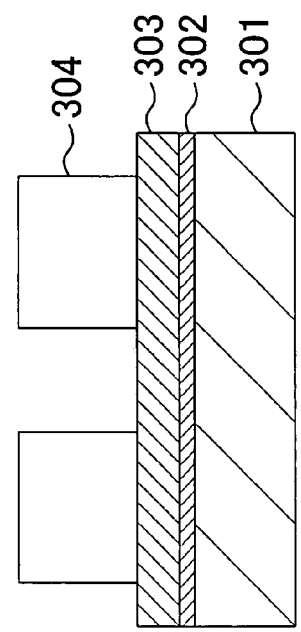

Next, as illustrated with FIG. 6F, an implantation protection film 306 is formed to cover the silicon nitride films 304. The implantation protection film 306 is formed by a silicon oxide film and has a film thickness of 5 nm.

Next, as illustrated with FIG. 7A, ion implantation 3a of, for example, $B^+$ is performed along a direction having an implantation angle inclined by 25° from a normal direction to a principal plane of the semiconductor substrate 301 to form a pocket implantation layer 307. In this case, the ion implantation 3a is performed under the condition of the implantation energy of 20 keV and $2 \times 10^{13}$ atoms/cm$^{-2}$.

Then, as illustrated with FIG. 7B, ion implantation 3b of, for example, $As^+$ is performed substantially along the normal direction to the principal surface of the semiconductor substrate 301 to form a bit line diffusion layer 308. In this case, the ion implantation 3b is performed under the condition of the implantation energy of 50 keV and $2 \times 10^{15}$ atoms/cm$^{-2}$.

Then, as illustrated with FIG. 7C, on the implantation protection film 306, a buried dielectric film 309 of a silicon oxide film is formed by high-density plasma CVD.

Then, as illustrated with FIG. 7D, polishing is performed by CMP until the silicon nitride films 304 are exposed. In this case, it is preferable that the silicon nitride films 304 are over-polished as shown in FIG. 7D. This provides a shape having a smooth surface without residue.

Then, as illustrated with FIG. 7E, using hydrofluoric acid, an upper part of the buried dielectric film is removed by etching to adjust the height.

Then, as illustrated with FIG. 7F, the silicon nitride films 304 are removed to expose surfaces of the lower polysilicon films 303.

Then, as illustrated with FIG. 7G, an upper polysilicon film 310 is formed in contact with the lower polysilicon films 303. Then, the upper polysilicon film 310 is patterned to be a desired shape forming word lines.

According to the above-mentioned method of fabricating the nonvolatile semiconductor memory device of the present embodiment, the upper part of each silicon nitride film 304 is first formed into a rounded shape, and then pocket implantation is performed at an angle. Therefore, the "shadow" region in the case of pocket implantation performed at an angle can be reduced. Accordingly, even if the space between the polysilicon films 303 adjacent to each other is small, the pocket implantation can be performed at an implantation angle greatly inclined from the normal to the principal plane of the semiconductor substrate 301. This makes it possible to easily realize miniaturization and suppression of a short-channel effect concurrently. Moreover, as described above, it is possible to simplify the fabrication step.

In the present embodiment, the upper part of each silicon nitride film 304 has a rounded shape. However, the shape of the silicon nitride film 304 is, as a standard, the same as the description in Embodiment 2.

Embodiment 4

A nonvolatile semiconductor memory device of Embodiment 4 of the present invention will be described below with reference to FIG. 8A through FIG. 8F and FIG. 9A through FIG. 9F.

FIG. 8A through FIG. 8F and FIG. 9A through FIG. 9F are cross-sectional views illustrating steps in a method of fabricating the nonvolatile semiconductor memory device of Embodiment 4 of the present invention.

Figure 8A:
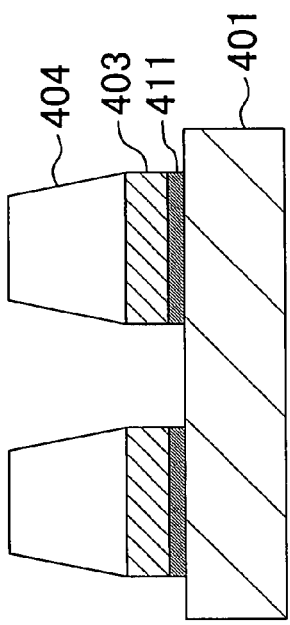
FIG. 8A through FIG. 8F are cross-sectional views illustrating steps in a method of fabricating a nonvolatile semiconductor memory device of Embodiment 4 of the present invention.

First, as illustrated with FIG. 8A, on a semiconductor substrate 401, a tunnel film 411 having a film thickness of 10 nm is formed. Then, on the tunnel film 411, a lower polysilicon film 403 having a film thickness of 40 nm and a silicon nitride film 404 having a film thickness of 150 nm are sequentially formed.

Figure 8B:
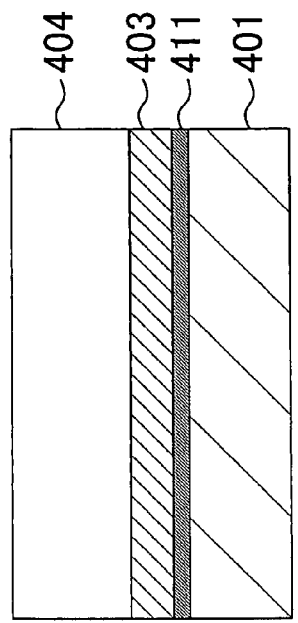

Next, as illustrated with FIG. 8B, on the silicon nitride film 404, photoresist 405 is applied, and then the photoresist 405 in desired regions is removed.

Figure 8C:
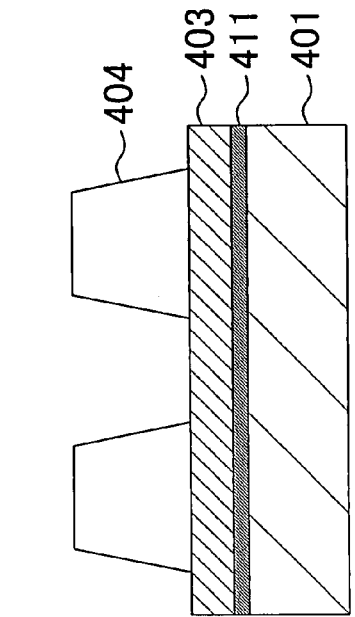

Then, as illustrated with FIG. 8C, the silicon nitride film 404 is etched to form silicon nitride films 404 having side surfaces in a normally tapered shape at about 85°. In this case, etching is performed under such a condition that for example, the flow rate of a $CF_4$ gas is $150 \times 10^{-3}$ (ml/min), the flow rate of a $CHF_3$ gas is $170 \times 10^{-3}$ (ml/min), the flow rate of an $O_2$ gas is $6 \times 10^{-3}$ (ml/min), the pressure is 8 (Pa), the upper electrode power is 550 (W), the lower electrode power is 500 (W), and the period is 120 seconds. Then the photoresist 405 is removed.

Figure 8D:
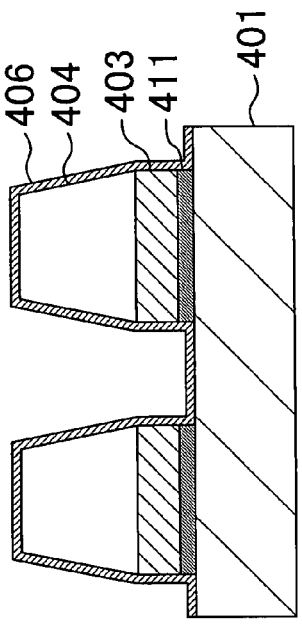

Next, as illustrated with FIG. 8D, using the silicon nitride films 404 as a mask, the polysilicon film 403 and the tunnel film 411 are sequentially removed by etching to expose the semiconductor substrate 401. At this moment, a space between polysilicon films 403 adjacent to each other with the semiconductor substrate 401 being exposed therebetween is 80 nm for example.

Figure 8E:
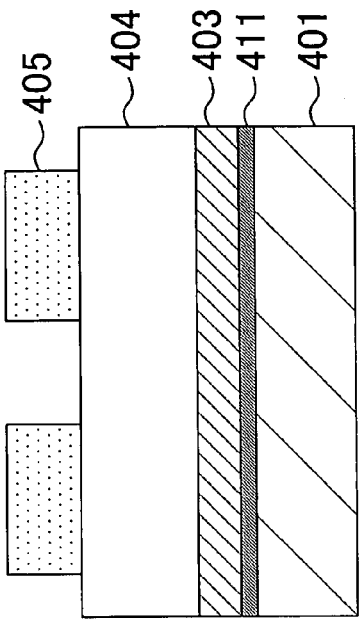

Next, as illustrated with FIG. 8E, an implantation protection film 406 is formed to cover the silicon nitride films 404. The implantation protection film 406 is formed by a silicon oxide film and has a film thickness of 5 nm.

Figure 8F:
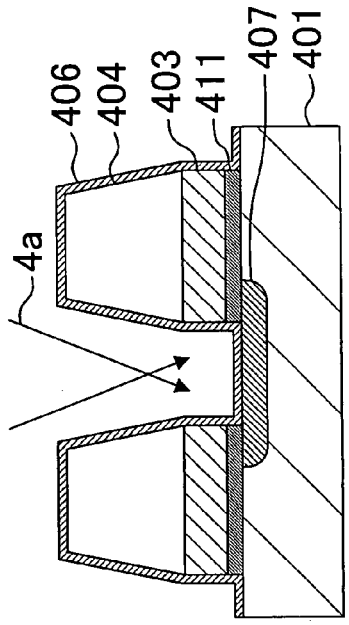

Next, as illustrated with FIG. 8F, ion implantation 4a of, for example, $B^+$ is performed along a direction having an implantation angle inclined by 25° from a normal direction to a principal plane of the semiconductor substrate 401 to form a pocket implantation layer 407. In this case, the ion implantation 4a is performed under the condition of the implantation energy of 20 keV and $2 \times 10^{13}$ atoms/cm$^{-2}$.

Figure 9A:
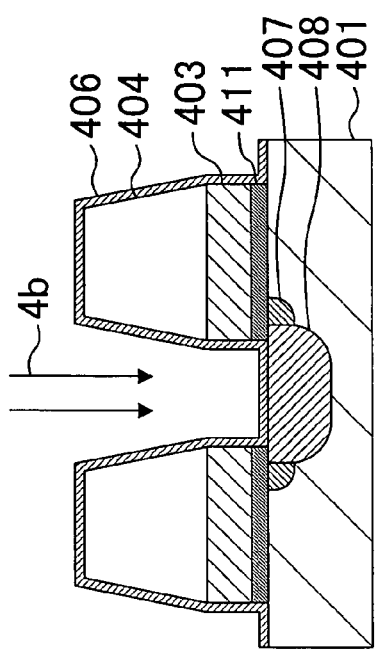
FIG. 9A through FIG. 9F are cross-sectional views illustrating steps in the method of fabricating the nonvolatile semiconductor memory device of Embodiment 4 of the present invention.

Then, as illustrated with FIG. 9A, ion implantation 4b of, for example, $As^+$ is performed substantially along the normal direction to the principal surface of the semiconductor substrate 401 to form a bit line diffusion layer 408. In this case, the ion implantation 4b is performed under the condition of the implantation energy of 50 keV and $2 \times 10^{15}$ atoms/cm$^{-2}$.

Figure 9B:
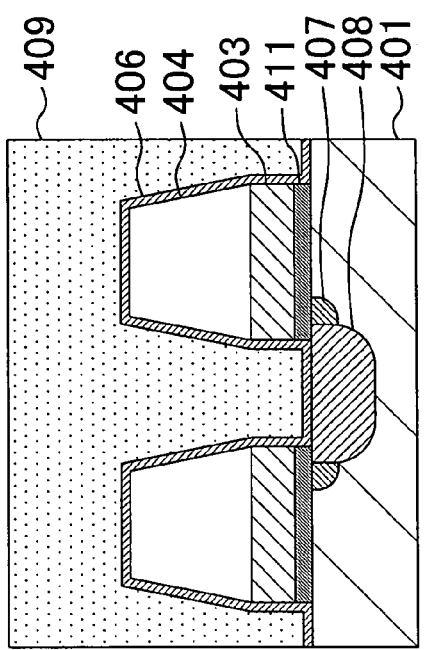

Then, as illustrated with FIG. 9B, on the implantation protection film 406, a buried dielectric film 409 of a silicon oxide film is formed by high-density plasma CVD.

Figure 9C:
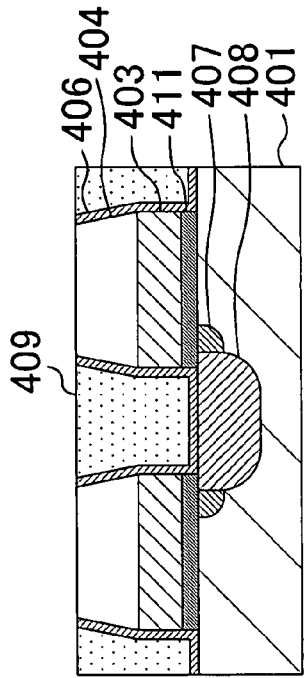

Then, as illustrated with FIG. 9C, polishing is performed by CMP until the silicon nitride films 404 are exposed. In this case, it is preferable that the silicon nitride films 404 are over-polished as shown in FIG. 9C. This provides a shape having a smooth surface without residue.

Figure 9D:
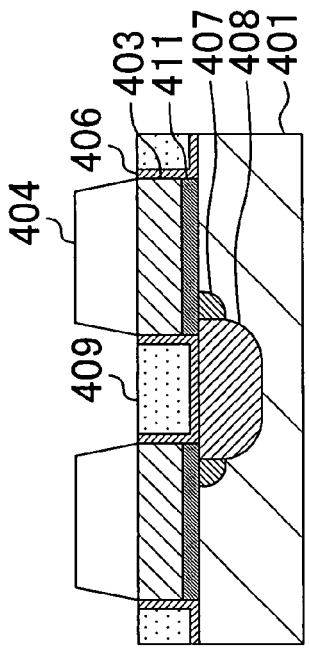

Then, as illustrated with FIG. 9D, using hydrofluoric acid, an upper part of the buried dielectric film is removed by etching to adjust the height.

Figure 9E:
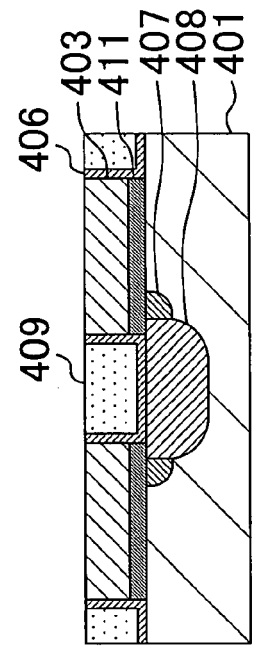

Then, as illustrated with FIG. 9E, the silicon nitride films 404 are removed to expose surfaces of the lower polysilicon films 403.

Figure 9F:
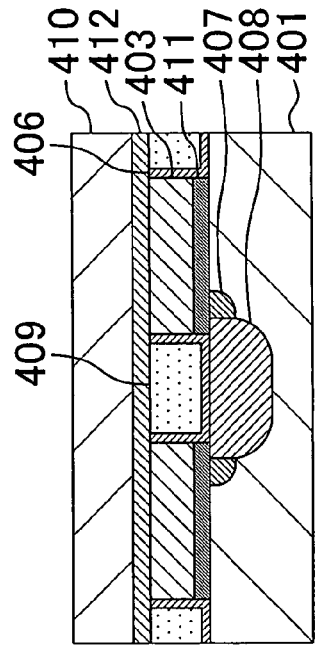
Figure 10A:
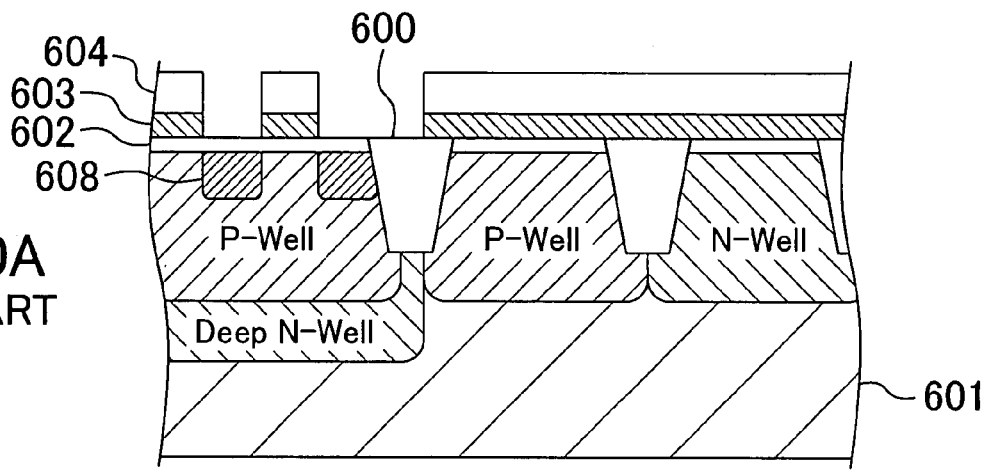
FIG. 10 shows cross-sectional views with which steps in the method of fabricating a nonvolatile semiconductor memory device of a first background art is described.
Figure 10B:
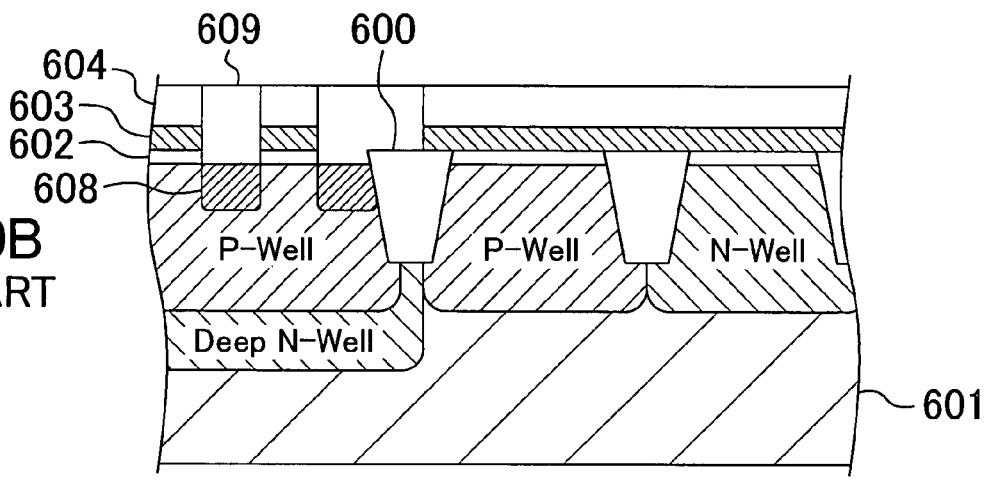
Figure 10C:
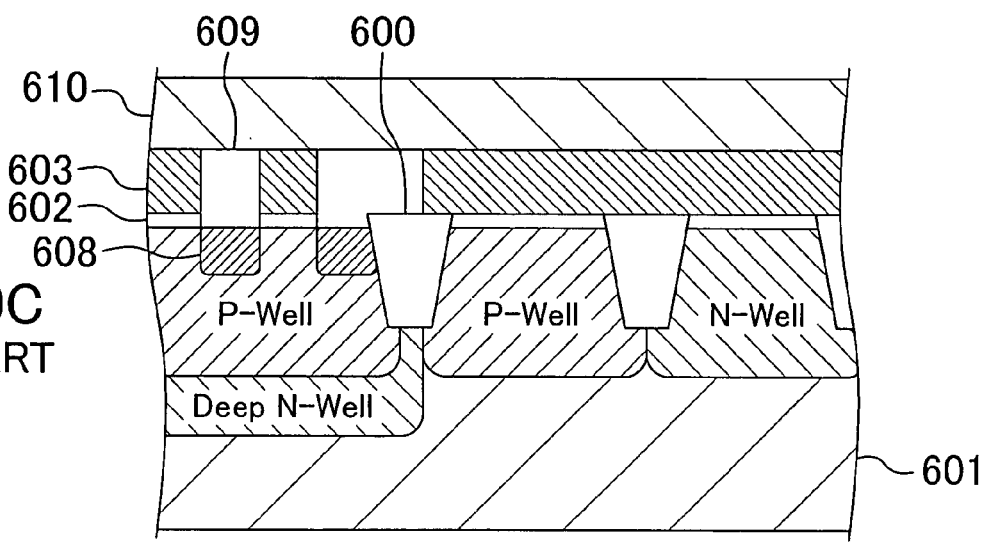
Figure 11A:
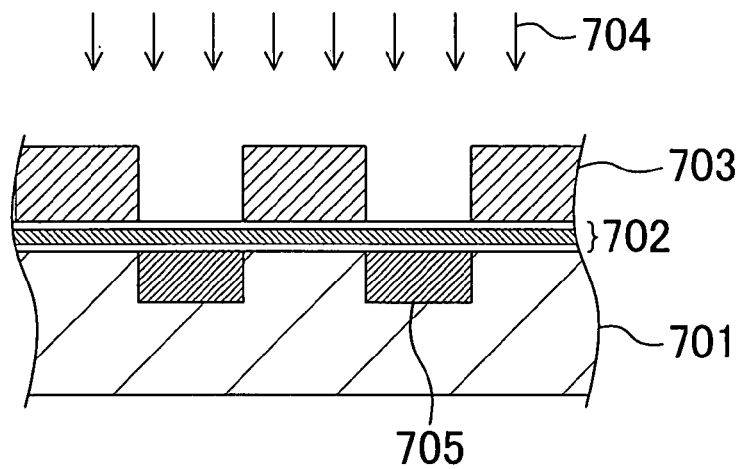
FIG. 11 shows cross-sectional views with which steps in the method of fabricating a nonvolatile semiconductor memory device of a second background art is described.
Figure 11B:
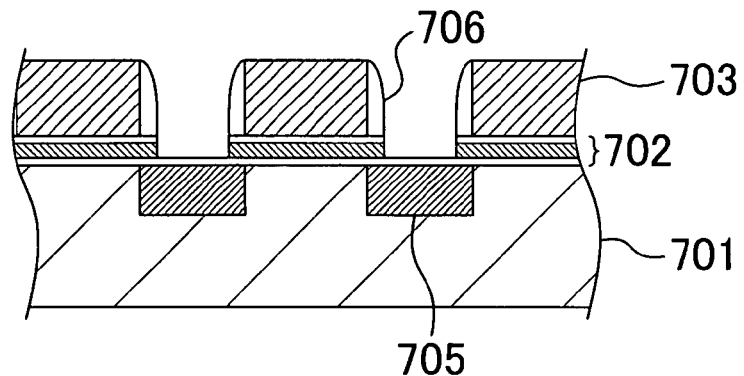
Figure 11C:
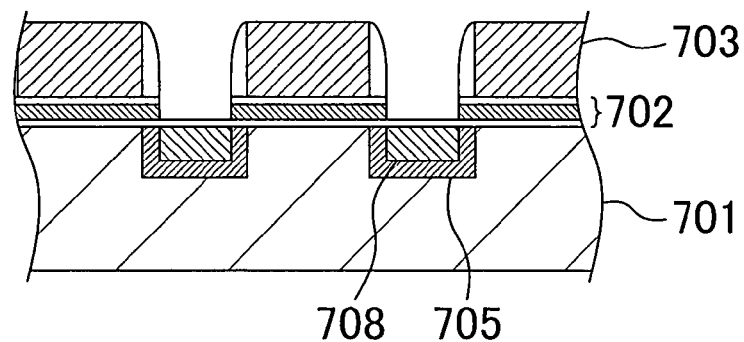
Figure 12:
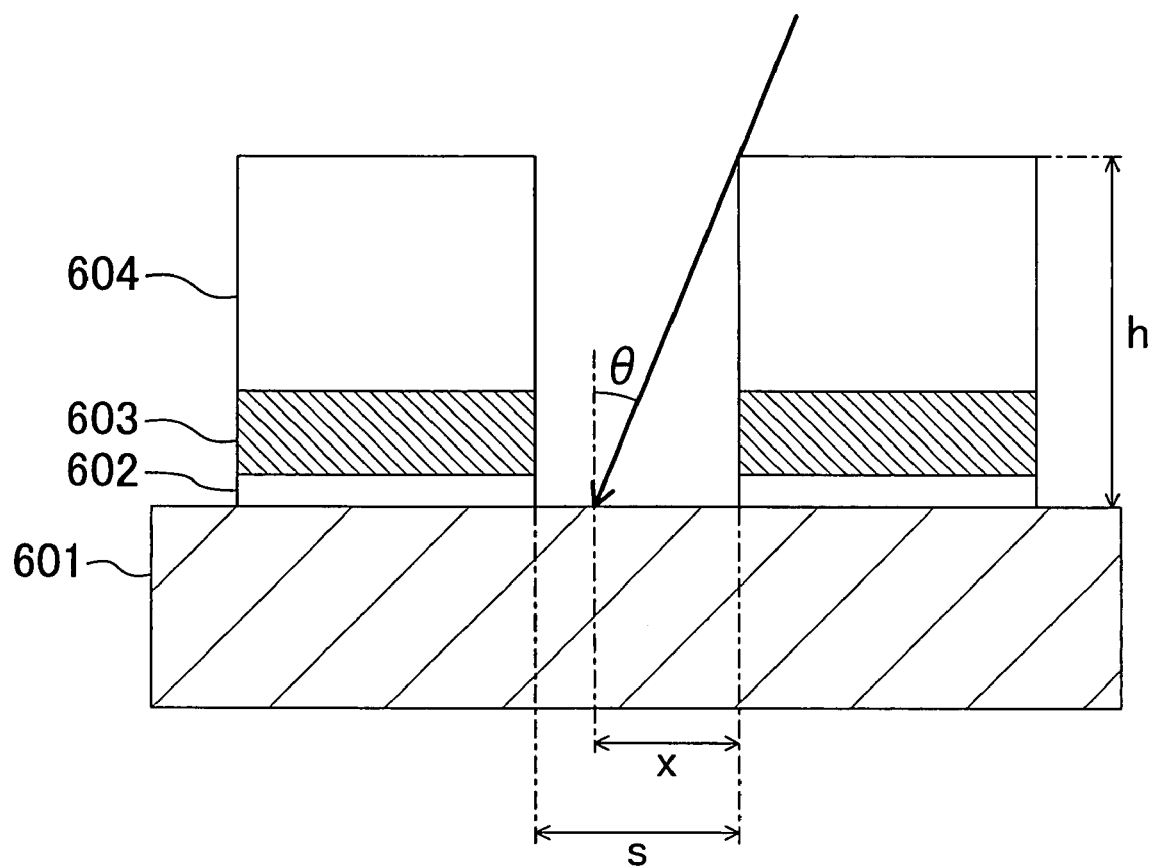
FIG. 12 is a cross-sectional view with which problems in the method of fabricating a nonvolatile semiconductor memory device of background arts are described.

Then, as illustrated with FIG. 9F, an inter-electrode dielectric film 412 and an upper polysilicon film 410 are sequentially formed over the lower polysilicon films 403. Then, the upper polysilicon film 410 and the inter-electrode dielectric film 412 are patterned to be a desired shape forming word lines.

According to the above-mentioned method of fabricating the nonvolatile semiconductor memory device of the present embodiment, the silicon nitride films 404 having side surfaces in a tapered shape are formed, and then pocket implantation is performed at an angle. Therefore, the "shadow" region in the case of pocket implantation performed at an angle can be reduced. Accordingly, even if the space between the polysilicon films 403 adjacent to each other is small, the pocket implantation can be performed at an implantation angle greatly inclined from the normal to the principal plane of the semiconductor substrate 401. This makes it possible to easily realize miniaturization and suppression of a short-channel effect concurrently.

Since the silicon nitride film 404 of the present embodiment has a normally tapered shape, the expressions in Embodiment 1 can be likewise applicable to the present embodiment.

In the present embodiment, descriptions have been given with reference to a case where the silicon nitride film 404 is formed into a normally tapered shape. However, as described in Embodiments 2 and 3, the steps of forming an upper part of the silicon nitride film 404 into a rounded shape is also applicable to the present embodiment.

In the Embodiments mentioned above, descriptions have been given with reference to a case where ion implantation from a direction having an implantation angle inclined from the normal direction to a principal plane of the semiconductor substrate is first performed, and then ion implantation from a substantially normal direction to the principal plane of the semiconductor substrate is performed. However, the order of ion implantation may be reversed.

As described above, the method of fabricating the nonvolatile semiconductor memory device of the present invention is especially applicable to a method of fabricating a nonvolatile semiconductor memory device having a virtual array type configuration.

What is claimed is:

1. A method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines, the method comprising the steps of:
   (a) forming a layered dielectric film on the semiconductor substrate;
   (b) forming a first conductive film including silicon as a main component on the layered dielectric film;
   (c) forming a first dielectric film on the first conductive film;
   (d) patterning the first dielectric film and the first conductive film such that the first dielectric films and first conductive films are left side by side in the column direction to form a layered pattern composed of the first dielectric films and the first conductive films; and
   (e) performing first impurity implantation to form a first impurity diffusion layer being the same in conductivity type as the semiconductor substrate, the first impurity implantation being performed along a direction having an inclination angle to a normal direction to a principal plane of the semiconductor substrate by using the layered pattern as a mask, wherein:
   step (d) includes:
      (da1) patterning the first dielectric film by selective etching such that the first dielectric films having a shape with a width narrower in an upper surface than in a lower surface are left side by side in the column direction; and
      (da2) after step (da1), patterning the first conductive film to form the first conductive films having a substantially vertical shape by using the patterned first dielectric films as a mask, and
   in step (c), the first dielectric film is formed to have a thickness larger than a total thickness of the layered dielectric film and the first conductive film.

2. The method of claim 1, further comprising the step of:
   (f) after step (d), performing second impurity implantation to form a second impurity diffusion layer having a conductivity type opposite to that of the semiconductor substrate, the second impurity implantation being performed along the normal direction to the principal plane of the semiconductor substrate by using the patterned first dielectric films and the patterned first conductive films as a mask.

3. The method of claim 1, further comprising the step of:
   (g) after steps (e) and (f), filling a second dielectric film in regions from which the first dielectric film and the first conductive film are removed in the patterning.

4. The method of claim 3, further comprising after step (g), the steps of:
   (h) removing the first dielectric films to expose surfaces of the first conductive films;
   (i) forming a second conductive film such that the second conductive film is directly in contact with the exposed surfaces of the first conductive films and covers the second dielectric film; and
   (j) patterning the second conductive film by selective etching such that second conductive films are left side by side in the row direction.

5. The method of claim 1, wherein the layered dielectric film includes a charge trapping film.

6. The method of claim 1, wherein the shape with a width narrower in an upper surface than in a lower surface of the first dielectric films is a normally tapered shape.

7. The method of claim 1, wherein the shape with a width narrower in an upper surface than in a lower surface of the first dielectric films is a shape of a rounded upper part of the first dielectric films.

8. The method of claim 1, wherein the first conductive film including silicon as a main component is a polysilicon film.

9. A method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines, the method comprising the steps of:

(a) forming a layered dielectric film on the semiconductor substrate;

(b) forming a first conductive film including silicon as a main component on the layered dielectric film;

(c) forming a first dielectric film on the first conductive film;

(d) patterning the first dielectric film and the first conductive film such that the first dielectric films and first conductive films are left side by side in the column direction to form a layered pattern composed of the first dielectric films and the first conductive films; and (e) performing first impurity implantation to form a first impurity diffusion layer being the same in conductivity type as the semiconductor substrate, the first impurity implantation being performed along a direction having an inclination angle to a normal direction to a principal plane of the semiconductor substrate by using the layered pattern as a mask, wherein:

step (d) includes:

(db1) patterning the first dielectric film by selective etching such that the first dielectric films are left side by side in the column direction;

(db2) after step (db1), etching the first dielectric films to have a shape with a width narrower in an upper surface than in a lower surface; and (db3) after step (db2), patterning the first conductive film to form the first conductive films having a substantially vertical shape by using the etched first dielectric films as a mask, and in step (c), the first dielectric film is formed to have a thickness larger than a total thickness of the layered dielectric film and the first conductive film.

10. The method of claim 9, further comprising the step of:

(f) after step (d), performing second impurity implantation to form a second impurity diffusion layer having a conductivity type opposite to that of the semiconductor substrate, the second impurity implantation being performed along the normal direction to the principal plane of the semiconductor substrate by using the patterned first dielectric films and the patterned first conductive films as a mask.

11. The method of claim 10, further comprising the step of:

(g) after steps (e) and (f), filling a second dielectric film in regions from which the first dielectric film and the first conductive film are removed in the patterning.

12. The method of claim 11, further comprising after step (g), the steps of:

(h) removing the first dielectric films to expose surfaces of the first conductive films;

(i) forming a second conductive film such that the second conductive film is directly in contact with the exposed surfaces of the first conductive films and covers the second dielectric film; and (j) patterning the second conductive film by selective etching such that second conductive films are left side by side in the row direction.

13. The method of claim 9, wherein the layered dielectric film includes a charge trapping film.

14. The method of claim 9, wherein the shape with a width narrower in an upper surface than in a lower surface of the first dielectric films is a normally tapered shape.

15. The method of claim 9, wherein the shape with a width narrower in an upper surface than in a lower surface of the first dielectric films is a shape of a rounded upper part of the first dielectric films.

16. The method of claim 9, wherein the first conductive film including silicon as a main component is a polysilicon film.

17. A method of fabricating a nonvolatile semiconductor memory device having a memory array configuration including a plurality of bit lines each formed of a diffusion layer and a plurality of word lines formed over a surface region of a semiconductor substrate, the plurality of bit lines being arranged side by side in a column direction, and the plurality of word lines being arranged side by side in a row direction crossing the bit lines, the method comprising the steps of:

(a) forming a layered dielectric film on the semiconductor substrate;

(b) forming a first conductive film including silicon as a main component on the layered dielectric film;

(c) forming a first dielectric film on the first conductive film;

(d) patterning the first dielectric film and the first conductive film such that the first dielectric films and first conductive films are left side by side in the column direction to form a layered pattern composed of the first dielectric films and the first conductive films; and (e) performing first impurity implantation to form a first impurity diffusion layer being the same in conductivity type as the semiconductor substrate, the first impurity implantation being performed along a direction having an inclination angle to a normal direction to a principal plane of the semiconductor substrate by using the layered pattern as a mask, wherein:

step (d) includes:

(dc1) patterning the first dielectric film by selective etching such that the first dielectric films are left side by side in the column direction;

(dc2) after step (dc1), patterning the first conductive film to form the first conductive films having a substantially vertical shape by using the patterned first dielectric films as a mask; and (dc3) after step (dc2), etching the first dielectric films into a shape with a width narrower in an upper surface than in a lower surface, and in step (c), the first dielectric film is formed to have a thickness larger than a total thickness of the layered dielectric film and the first conductive film.

18. The method of claim 17, further comprising the step of:

(f) after step (d), performing second impurity implantation to form a second impurity diffusion layer having a conductivity type opposite to that of the semiconductor substrate, the second impurity implantation being performed along the normal direction to the principal plane of the semiconductor substrate by using the patterned first dielectric films and the patterned first conductive films as a mask.

19. The method of claim 18, further comprising the step of:

(g) after steps (e) and (f), filling a second dielectric film in regions from which the first dielectric film and the first conductive film are removed in the patterning.

20. The method of claim 19, further comprising after step (g), the steps of:

(h) removing the first dielectric films to expose surfaces of the first conductive films;

(i) forming a second conductive film such that the second conductive film is directly in contact with the exposed surfaces of the first conductive films and covers the second dielectric film; and (j) patterning the second conductive film by selective etching such that second conductive films are left side by side in the row direction.

21. The method of claim 17, wherein the layered dielectric film includes a charge trapping film.

22. The method of claim 17, wherein the shape with a width narrower in an upper surface than in a lower surface of the first dielectric films is a normally tapered shape.

23. The method of claim 17, wherein the shape with a width narrower in an upper surface than in a lower surface of the first dielectric films is a shape of a rounded upper part of the first dielectric films.

24. The method of claim 17, wherein the first conductive film including silicon as a main component is a polysilicon film.

* * * * *